(12) United States Patent  
Frazier

(10) Patent No.: US 10,999,958 B2  
(45) Date of Patent: May 4, 2021

(54) ATTACHABLE PORTABLE PROTECTIVE CONTAINERS

(71) Applicant: Andrew G. C. Frazier, Sunnyvale, CA (US)

(72) Inventor: Andrew G. C. Frazier, Sunnyvale, CA (US)

( * ) Notice: Subject to any disclaimer, the term of this patent is extended or adjusted under 35 U.S.C. 154(b) by 101 days.

(21) Appl. No.: 16/442,643

(22) Filed: Jun. 17, 2019

(65) Prior Publication Data

US 2019/0394910 A1 Dec. 26, 2019

Related U.S. Application Data

(60) Provisional application No. 62/687,526, filed on Jun. 20, 2018.

(51) Int. Cl.
| | |
|---|---|
| *H05K 5/02* | (2006.01) |
| *H05K 5/06* | (2006.01) |
| *H05K 9/00* | (2006.01) |
| *A45F 5/02* | (2006.01) |

(52) U.S. Cl.
CPC ............ *H05K 9/0049* (2013.01); *A45F 5/02* (2013.01); *H05K 5/0221* (2013.01); *H05K 5/0226* (2013.01); *H05K 5/06* (2013.01)

(58) Field of Classification Search
CPC ....... H05K 5/0221; H05K 5/0226; H05K 5/06
See application file for complete search history.

(56) References Cited

U.S. PATENT DOCUMENTS

| | | | | |
|---|---|---|---|---|
| 3,741,815 | A | * | 6/1973 | Peterson ............. H01M 2/1072 429/176 |
| 5,123,681 | A | * | 6/1992 | Kos ........................ E05C 19/06 206/710 |
| 6,015,064 | A | * | 1/2000 | Liu ......................... A45C 13/02 206/372 |
| 6,184,280 | B1 | | 2/2001 | Shibuta |
| 6,196,405 | B1 | * | 3/2001 | Kambouris .......... B65D 43/164 206/701 |
| 6,953,126 | B2 | | 10/2005 | Parker et al. |
| 7,663,879 | B2 | | 2/2010 | Richardson et al. |
| 7,780,048 | B2 | | 8/2010 | Howell |
| 8,361,608 | B1 | | 1/2013 | Hansen et al. |
| 8,523,029 | B2 | | 9/2013 | Rogers et al. |
| 8,952,780 | B2 | | 2/2015 | Simpson |
| 10,143,294 | B1 | | 12/2018 | Matson et al. |
| 2004/0107745 | A1 | * | 6/2004 | Williamson ............. E05B 65/48 70/2 |

(Continued)

*Primary Examiner* — Hung V Ngo

(74) *Attorney, Agent, or Firm* — Franklin & Associates International Inc; Matthew F. Lambrinos

(57) ABSTRACT

Apparatus for protecting sensitive equipment from impact, dust, dirt, moisture, smoke, and flame has a container that attaches to load bearing equipment used by military, law enforcement and related professions. Apparatus for an attachable protective case capable isolating sensitive equipment from electromagnetic radiation. The apparatus can include an attachment component pivotably associated with the container. A distal end of the attachment component can include a locking feature releasably engageable with a corresponding locking feature disposed on a portion of the container such that the attachment component captures a portion of material of a separate device between the attachment component and the container.

20 Claims, 16 Drawing Sheets

(56) References Cited

U.S. PATENT DOCUMENTS

| | | | |
|---|---|---|---|
| 2007/0125137 A1* | 6/2007 | Galant | G06F 21/88 |
| | | | 70/58 |
| 2009/0261695 A1* | 10/2009 | Yeh | G06F 1/181 |
| | | | 312/223.2 |
| 2009/0321303 A1* | 12/2009 | Kang | B65D 51/242 |
| | | | 206/703 |
| 2011/0036747 A1* | 2/2011 | Petrick | G06F 1/182 |
| | | | 206/701 |
| 2012/0175391 A1 | 7/2012 | Rogers et al. | |
| 2013/0258573 A1 | 10/2013 | Muday et al. | |
| 2014/0209502 A1* | 7/2014 | Kaddas | E04B 1/72 |
| | | | 206/722 |
| 2017/0150623 A1* | 5/2017 | Mau | G06F 21/88 |

* cited by examiner

ATTACHABLE PORTABLE PROTECTIVE CONTAINERS

CROSS-REFERENCE TO RELATED APPLICATION

This application claims the benefit of priority under 35 U.S.C. § 119(e) based upon U.S. provisional patent application Ser. No. 62/687,526 filed on Jun. 20, 2018. The entire disclosure of the prior provisional application is incorporated herein by reference.

BACKGROUND

Technical Field

This application relates generally to the field of portable protective containers, in particular, portable containers that can be attached to military, law enforcement or other tactical load carrying equipment such as bulletproof vests, backpacks, and equipment carriers. This application further covers portable protective containers that provide electromagnetic radiation isolation, in particular, containers that isolate electronic devices from transmitting or receiving electromagnetic signals.

Background Description

Military, law enforcement and other related personnel are increasingly required to utilize electronics and other sensitive and or fragile equipment in the execution of their duties.

Personnel may be required to carry communication and navigation equipment such as radios, mobile phones, electronic tablets, global positioning systems (GPS), timekeeping equipment, and many other, similarly sized, mission-specific gear. This gear may be used intermittently and or constantly during missions, thus, user accessibility to the equipment must be maintained.

Current load carrying equipment is generally comprised of sewn textile pockets and pouches that secure, but often do not protect sensitive equipment from impact or other external forces due to their compliant structure. More rigid protective cases, typically polymer or metal, provide impact resistance but do not readily attach to load carrying equipment. This results in protective cases being stowed in backpacks, pouches or pockets, thus reducing the accessibility of the communication, navigation, or other equipment when needed.

Furthermore, electronic equipment for communication, navigation, and other mission specific applications need to be protected from moisture and other environmental hazards such as dust, dirt, oils, chemicals, smoke, and flame. Sewn textile products do no provide consistent protection from these hazards due to their permeable nature.

Often, users are required to utilize electronic equipment while moving and at times when the user's hands are otherwise indisposed.

In many cases, mission-specific electronic equipment needs to be isolated from electromagnetic communication to maintain operational security for personnel in hostile environments. Currently, personnel turn off their equipment when not in use to avoid unwanted communication or detection or use nickel-plated polymer bags that act as a faraday cage to isolate the equipment. A faraday cage is any device that creates a continuous conductive surface around an object in sufficient density and conductivity to isolate it from external electromagnetic waves of a certain frequency and or wavelength. Turning off electronic devices is disadvantageous for personnel because it requires additional steps of powering on a device each time it needs to be used. Nickel plated bags are also disadvantageous due to their lack of impact protection and their requirement to be sealed and or re-sealed to provide a continuous conductive surface for isolation.

Electromagnetic isolation of evidence and or enemy communication equipment is also often a mission objective for military, law enforcement and other related professions. In the case of evidence, personnel often need to isolate a mobile phone or other data source in order to prevent the information stored on the device from being remotely erased. Current devices include nickel-plated polymer bags and large metallic boxes. Nickel-plated bags, as discussed above are not convenient or protective, and large metal boxes are not easily portable.

Enemy communication may also include mobile phones and or other receivers that are used to remotely detonate explosives. Personnel need to be able to electromagnetically isolate these communication devices quickly and completely when discovered to prevent explosive detonation and facilitate safe disposal.

Thus, there remains an unmet need in the art for a portable protective enclosure capable of being attached to standard load-carrying equipment used by military, law enforcement and other related personnel. This protective enclosure needs to provide protection from impact, moisture, contaminants, and other environmental hazards. Additionally, a portable protective enclosure needs to allow the user to partially open the enclosure such that the user can utilize it as a platform for accessing and manipulating the devices contained therein without their removal from the enclosure. Furthermore, there remains an unmet need for an attachable enclosure that provides protection from environmental hazards and additionally provides complete or adjustable electromagnetic isolation for electronic devices.

SUMMARY

In view of the foregoing disadvantages inherent in the known types of rigid protective cases, the present technology provides a novel attachable portable protective containers, and overcomes one or more of the mentioned disadvantages and drawbacks of these known devices. As such, the general purpose of the present technology, which will be described subsequently in greater detail, is to provide a new and novel attachable portable protective containers and method which has all the advantages of the prior art mentioned heretofore and many novel features that result in an attachable portable protective container which is not anticipated, rendered obvious, suggested, or even implied by the prior art, either alone or in any combination thereof.

While the above-described known devices fulfill their respective, particular objectives and requirements, the aforementioned devices or systems do not describe an attachable portable protective container that allows for attachment to articles or clothing or equipment, in possible combination with providing a sealable cavity for electromagnetic radiation isolation.

A need exists for a new and novel attachable portable protective containers that can be used for attachment to articles or clothing or equipment, in combination with providing a sealable cavity for electromagnetic radiation isolation. In this regard, the present technology substantially fulfills this need. In this respect, the attachable portable protective containers according to the present technology substantially departs from the conventional concepts and designs of the prior art, and in doing so provides an apparatus primarily developed for the purpose of attachment to articles or clothing or equipment, in combination with providing a sealable cavity for electromagnetic radiation isolation.

According to one aspect of the present technology, the present technology may comprise a container system including enclosable structures and an attachment component. The structures are pivotably associated with each other to permit relative rotation and opening and closing of the structures. The hollow structures can be apposed to each other and configured to create a sealed cavity when closed. The attachment component can include a distal end and a proximal end. The proximal end can include a hinge mechanism associated with at least one of the structures. The distal end can have a locking feature configured to releasably engage with a corresponding locking feature disposed on the at least one of the structures such that the attachment component captures a portion of material of a separate device between the attachment component and the at least one of the structures.

According to another aspect of the present technology, the present technology may comprise a container system including enclosable structures and an attachment component associated with at least one of the structures. The structures are pivotably associated with each other to permit relative rotation and opening and closing of the structures. The structures are configured to create a sealed cavity when closed. The attachment component is configured to capture a portion of material of a separate device between the attachment component and at least one of the structures.

According to another aspect of the present technology, a device may comprise two hollow structures that are apposed and configured to create a sealed cavity. A hinge can be located along a first side of the two hollow structures to permit relative rotation and opening and closing of the hollow structures. A latch on a second side opposite the first side. The latch being fixed to one side and releasably engaged in the second hollow structure by way of a locking member. An attachment component including a distal and proximal end. The proximal end can be comprised of a hinge mechanism connected to one or more of the hollow structures creating the sealed cavity. The distal end of the attachment component can have at least one elongate member with a locking feature disposed on the distal end. Wherein the locking feature can be able to releasably engage with a corresponding locking feature disposed on at least one of the hollow structures such that the attachment component captures a portion of material of a separate device between the attachment component and at least one of the hollow structures.

According to yet another aspect of the present technology, a device may comprise two hollow structures that are apposed to create a sealed cavity. A hinge can be located along a first side of the two hollow structures to permit relative rotation and opening and closing of the sealed cavity. A latch on a second side opposite the first side. The latch can be fixed to one side and releasably engaged in the second hollow structure by way of a locking member. A recessed channel in at least one portion of the hollow structures slideably can be engaged with an additional panel. The additional panel can be able to be moved from one position wherein a combined thickness of the additional panel and an apposed wall of the hollow structure is as thick or thicker than the rest of the hollow structure and another position wherein the additional panel is no longer inside the recessed channel, leaving the remaining thickness of the hollow structure at the location of the recessed channel less than the rest of the hollow structure.

According to still yet another aspect of the present technology, the present technology may comprise a container system including a first and second hollow structure and an attachment component. The hollow structures are pivotably associated with each other to permit relative rotation and opening and closing of the hollow structures. The hollow structures can be apposed to each other and configured to create a sealed cavity when closed. The attachment component can include a distal end and a proximal end. The proximal end can include a hinge mechanism associated with at least one of the hollow structures. The distal end can have a locking feature configured to releasably engage with a corresponding locking feature disposed on the at least one of the hollow structures such that the attachment component captures a portion of material of a separate device between the attachment component and the at least one of the hollow structures. The hollow structures being configured to isolate an electronic equipment enclosed in the sealed cavity from electromagnetic radiation emanating outside the container system.

According to another aspect of the present technology, the present technology may comprise a container system including a first and second hollow structure and an attachment component. The hollow structures are pivotably associated with each other to permit relative rotation and opening and closing of the hollow structures. The hollow structures can be apposed to each other and configured to create a sealed cavity when closed. The attachment component can include a distal end and a proximal end. The proximal end can include a hinge mechanism associated with at least one of the hollow structures. The distal end can have a locking feature configured to releasably engage with a corresponding locking feature disposed on the at least one of the hollow structures such that the attachment component captures a portion of a Modular Lightweight Load-carrying Equipment and Pouch Attachment Ladder System (MOLLE/PALS) system of a separate device between the attachment component and the at least one of the hollow structures.

In some embodiments, the enclosable structures are at least a first hollow structure and a second hollow structure.

Some embodiments of the present technology can include a hinge located along a first side of the first and second hollow structures to permit the relative rotation and opening and closing of the hollow structures.

Some further embodiments can include a latch on a second side of the first hollow structure opposite the first side, the latch being releasably engageable with a locking member of the second hollow structure.

In some embodiments of the present technology, an aperture can be defined on the distal end of the attachment component and a corresponding aperture can be defined on a lateral side of the latch such that when the aperture and the corresponding aperture are aligned a separate locking or tamper evident device is insertable through both apertures to secure the attachment component relative to the hollow structures and prevent the latch from allowing the two hollow structures to be rotated apart.

In some embodiments of the present technology, the locking feature of the attachment component defines a window configured to releasably engage with a protrusion of the at least one of the hollow structures.

In some embodiments of the present technology, a plurality of friction plates can extend from each of the hollow structures are aligned and compressed by a fastening member to increase or decrease a force required to open, close or move the two apposed hollow structures relative to each other.

In some embodiments of the present technology, the fastening member can be a helical screw and a helically threaded nut arrangement. The helical screw and the helically threaded nut can be configured to increase or decrease a force required to open, close or move the two apposed hollow structures relative to each other.

In some embodiments of the present technology, the fastening member can be a camming lever attached to a helical screw and helically threaded nut arrangement. The camming lever, the helical screw and the helically threaded nut can be configured to increase or decrease a force required to open, close or move the two apposed hollow structures relative to each other.

In some embodiments of the present technology, at least one of the hollow structures can include a recessed channel, and an additional panel slideably engageable with the recessed channel. The additional panel can be configured to be moved from one position wherein a combined thickness of the additional panel and an apposed wall of the at least one of the hollow structures is as thick or thicker than the rest of the at least one of the hollow structures and another position wherein the additional panel is not inside the recessed channel, leaving the remaining thickness of the at least one of the hollow structures at the location of the recessed channel less than the rest of the at least one of the hollow structures.

In some embodiments of the present technology, the hollow structures can be comprised of or include conductive material and/or partially conductive material.

In some embodiments of the present technology, the conductive material can be metal and/or a metal-filled polymer.

The present technology may also include (brief description of additional elements and features that are not in the claims but might be claimed). There are, of course, additional features of the present technology that will be described hereinafter and which will form the subject matter of the claims attached.

BRIEF DESCRIPTION OF THE DRAWINGS

Certain preferred embodiments and modifications thereof will become apparent to those skilled in the art from the detailed description below having reference to the figures that follow. The present technology will be better understood and objects other than those set forth above will become apparent when consideration is given to the following detailed description thereof. Such description makes reference to the annexed drawings wherein.

The same reference numerals refer to the same parts throughout the various figures.

DETAILED DESCRIPTION OF THE PREFERRED EMBODIMENTS

In the following description, for purposes of explanation and not limitation, specific details are set forth, such as particular embodiments, procedures, techniques, etc. in order to provide a thorough understanding of the present technology. However, it will be apparent to one skilled in the art that the present technology may be practiced in other embodiments that depart from these specific details.

The following disclosure provides embodiments of systems and methods for portable protective containers capable of being attached to load bearing equipment and further providing protection from environmental hazards such as impact, moisture, dirt, dust, oils, smoke, and flame. The following disclosure further provides embodiments of portable protective containers capable of electromagnetically isolating the container's contents. The application of said containers includes, but is not limited to, portable protection and or isolation of communication and navigation equipment or other sensitive or fragile items.

Figure 1:
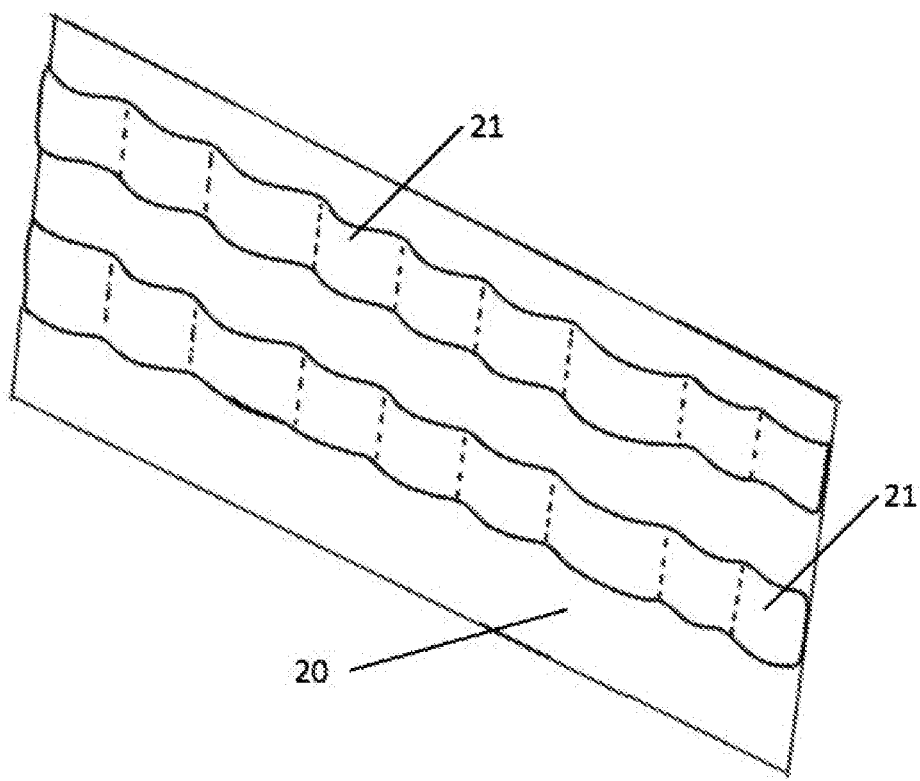
FIG. 1 is a perspective view of a sewn nylon webbing assembly in a M.O.L.L.E and/or P.A.L.S. configuration.

Military and law enforcement load-bearing equipment utilizes standard webbing systems such as Modular Lightweight Load-carrying Equipment and Pouch Attachment Ladder System (MOLLE/PALS) respectively. These systems are generally comprised of approximately 1-inch wide webbing sewn at intervals to load bearing equipment surfaces such as backpacks, pouches, ballistic vests and many other items known to those skilled in the art. FIG. 1 shows an illustration of two rows of MOLLE/PALS webbing 21 sewn to a surface 20.

Figure 2:
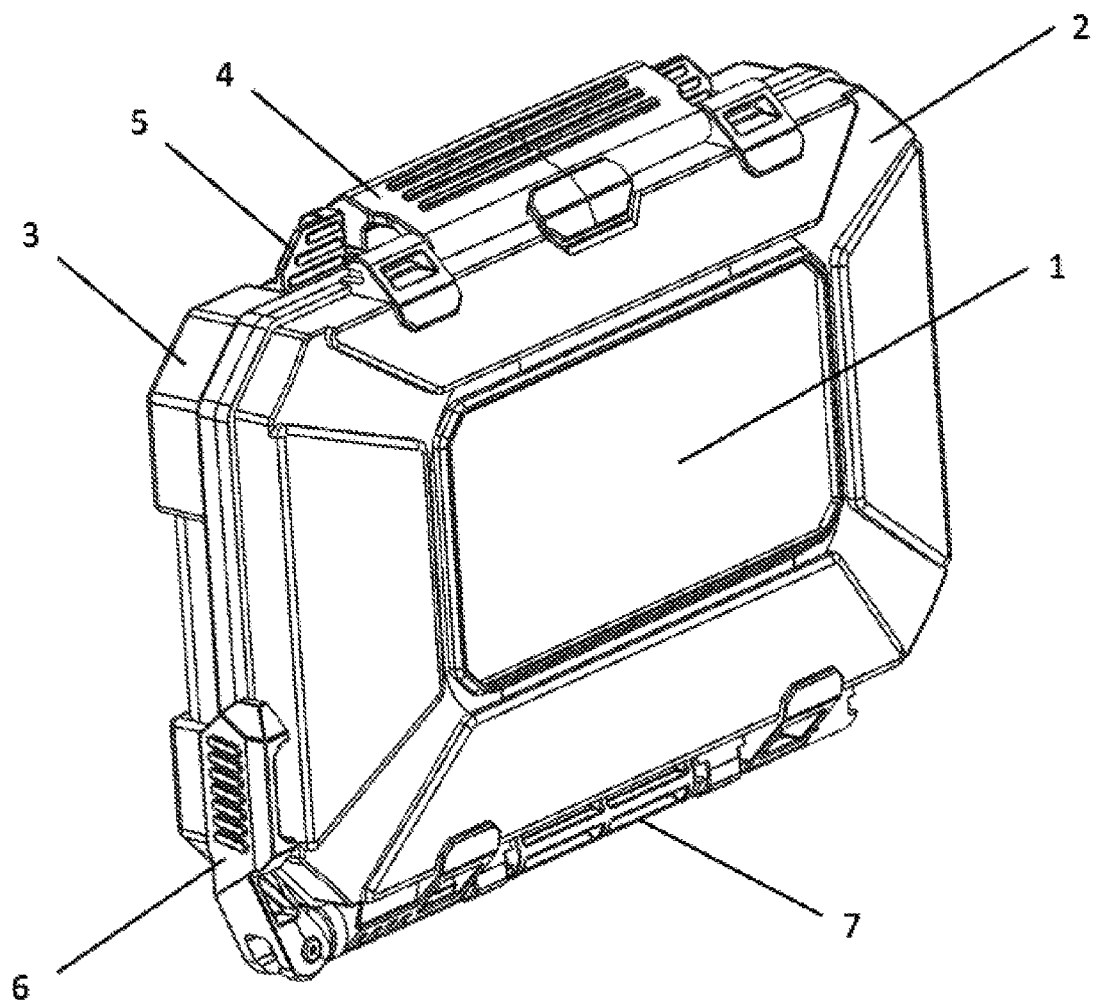
FIG. 2 is a perspective view of an attachable protective container in accordance with one or more embodiments.

FIG. 2 shows a perspective illustration of an embodiment of an attachable protective container 1 comprised principally of a front hollow structure 2 and a back hollow structure 3 whose concavities are apposed to create a protective space. Furthermore, FIG. 2 shows a latch 4 attached to the front hollow structure 2 and engaged on a corresponding lip on the back hollow structure 3. Alternately, the latch 4 could be permanently mounted on the back hollow structure 3 and designed to engage a locking feature on the front hollow structure 2. The front and back hollow structures are connected by hinge features 7 compromised of protrusions extending from said structures with concentric holes aligned by a cylindrical pin allowing the back and front hollow structures to rotate relative to each other.

A strap component 5 is attached to the hinge assembly 7. The strap component 5 pivots on the same axis as the front hollow structure 2 and back hollow structure 3 but could also be made to pivot on a separate axis of rotation. The strap component 5 is comprised of a distal end and a proximal end. The distal end includes a hollow, cylindrical aperture to accept a hinge pin, and a distal end with two elongate struts terminating with windows perpendicular to struts. The windows releasably engage protrusions on the back hollow structure 3. Alternately, the strap component 5 could be comprised of 1, 2, or many distal struts in order to engage more load-bearing equipment webbing loops or single straps. Furthermore, the strap component 5 could be comprised of elastic and or flexible materials and employ other releasable mechanisms such as dovetail joints, snaps, hook and loop fasteners and many other options known to those skilled in the art.

FIG. 2 also depicts a cam lever 6 used to adjust the friction between the front hollow structure 2 and back hollow structure 3 in its closed position. The cam lever 6 provides a compression force that increases friction between the components of the hinge located on the front hollow structure 2 and the back hollow structure 3 to be described further below.

Figure 3:
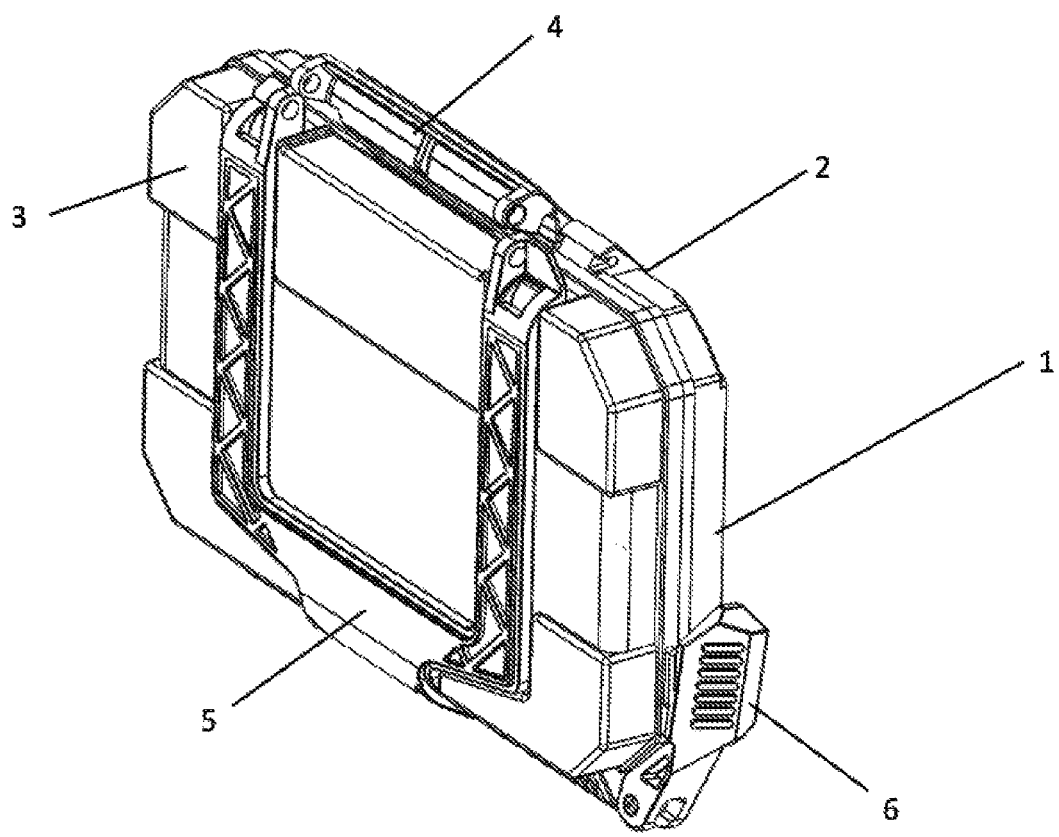
FIG. 3 is an alternate perspective view of an attachable protective container in accordance with one or more embodiments.

FIG. 3 shows and alternate perspective illustration of an embodiment of an attachable protective container 1. The strap component 5 may include molded, applied or otherwise constructed reinforcing elements to tune the flexibility of the distal struts such that they provide the mechanical strength required to retain the attachable protective container 1 on any load-bearing equipment or similar.

Figure 4:
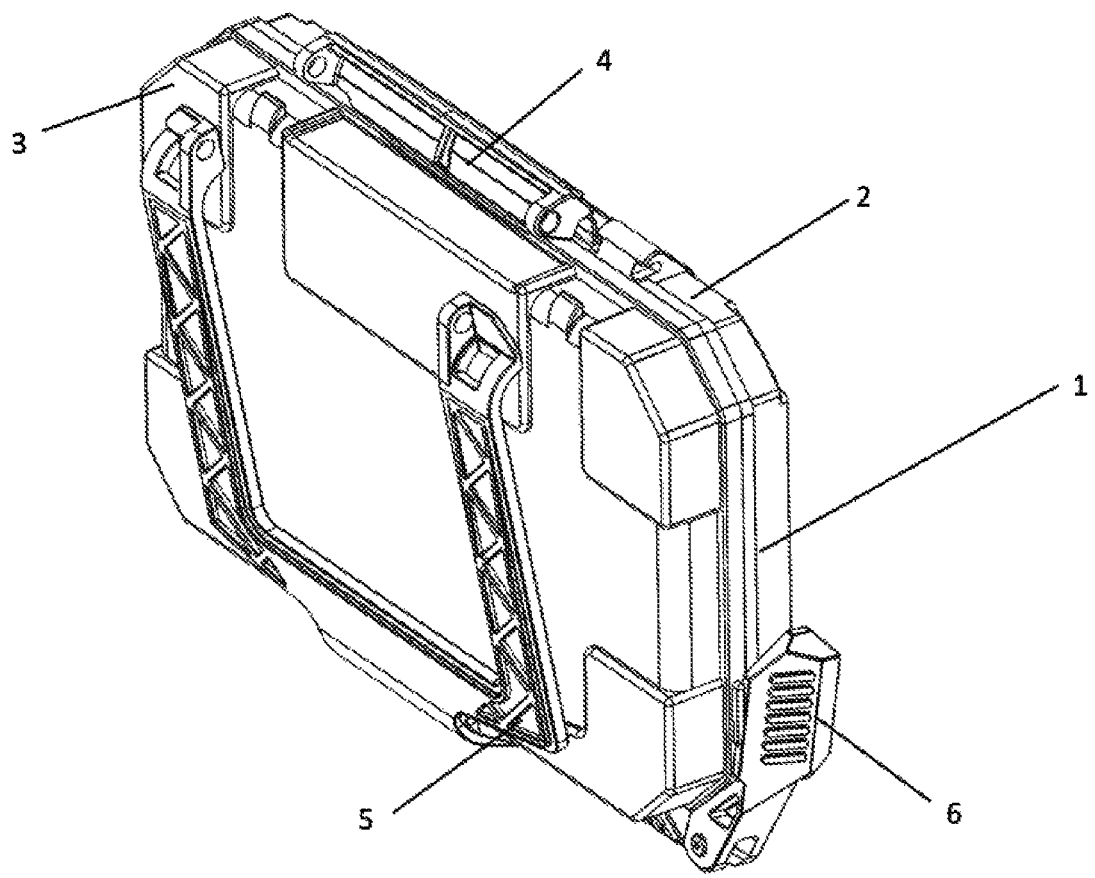
FIG. 4 is an alternate perspective view of an attachable protective container in accordance with one or more embodiments with attachment straps disengaged from their locking features.

FIG. 4 shows and alternate perspective illustration of an embodiment of an attachable protective container 1 with the strap component 5 released from the protrusions on the back hollow structure 3 and rotated apart from same. In the released configuration, the strap component's distal struts can be slid into MOLLE/PALS webbing loops 21 and or used to capture straps, wire, rope, webbing, and or other structures in order to attach the attachable protective container 1 to another object such as, but not limited to, load-bearing equipment.

Figure 5:
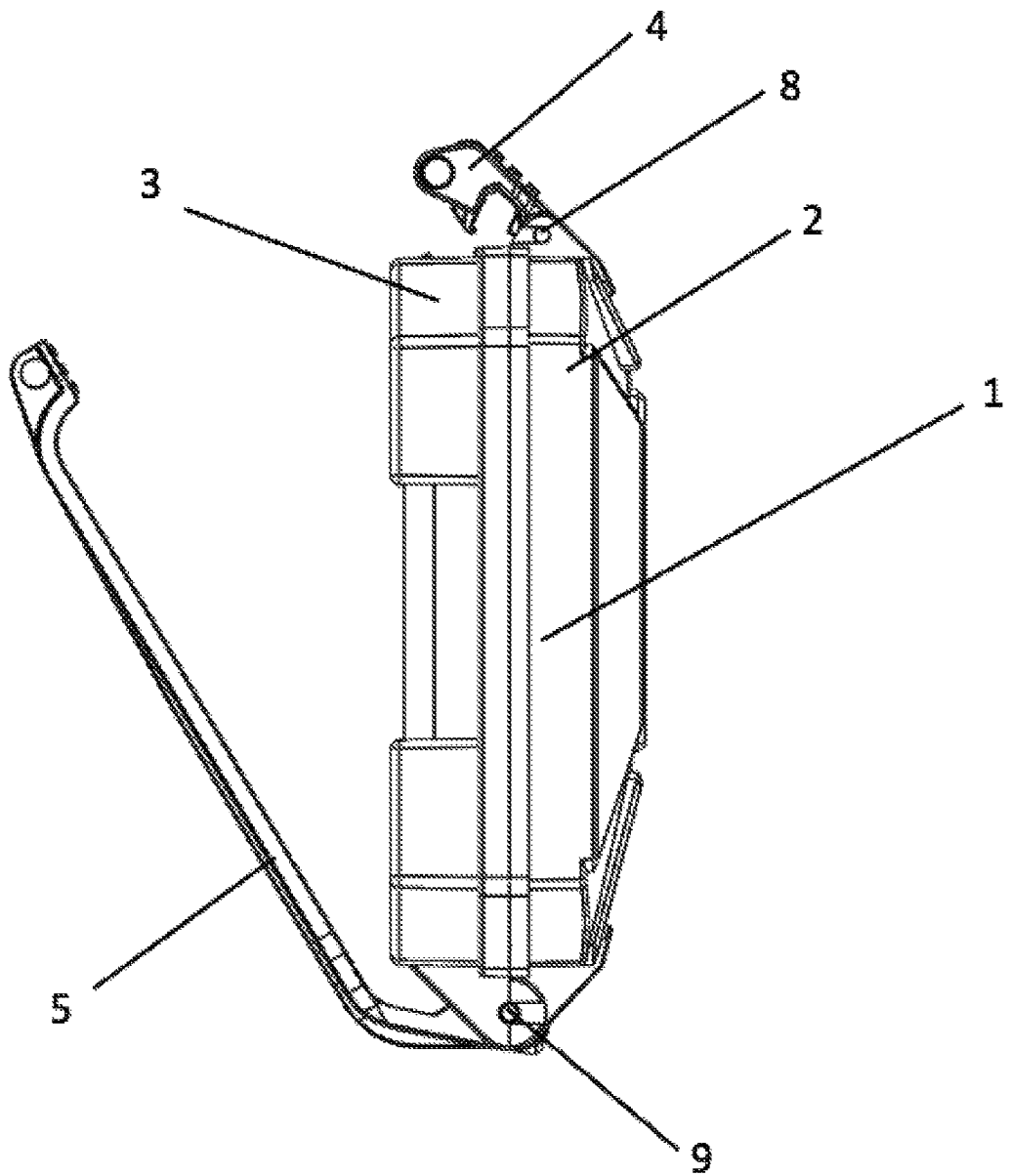
FIG. 5 is a side view of an attachable protective container in accordance with one or more embodiments with attachment straps disengaged from their locking features.

FIG. 5 shows a side view of an embodiment of an attachable protective container 1 including the latch 4 pivoting around a hinge pin 8 attached to a front hollow structure 2 and rotationally apart from the back hollow structure 3. The latch 4 includes a distal and proximal end. The proximal end of latch 4 houses a hinge pivoting aperture for accepting the hinge pin 8. The distal end includes a latch tooth to releasably engage a protrusion on the back hollow structure 3 to retain the back hollow structure 3 and front hollow structure 3 together. FIG. 5 further shows a hinge pin 9 engaged in the coaxial apertures of protrusions extending from the back hollow structure 3, front hollow structure 2, and strap component 5 allowing rotation of said components individually or in conjunction with each other.

Figure 6:
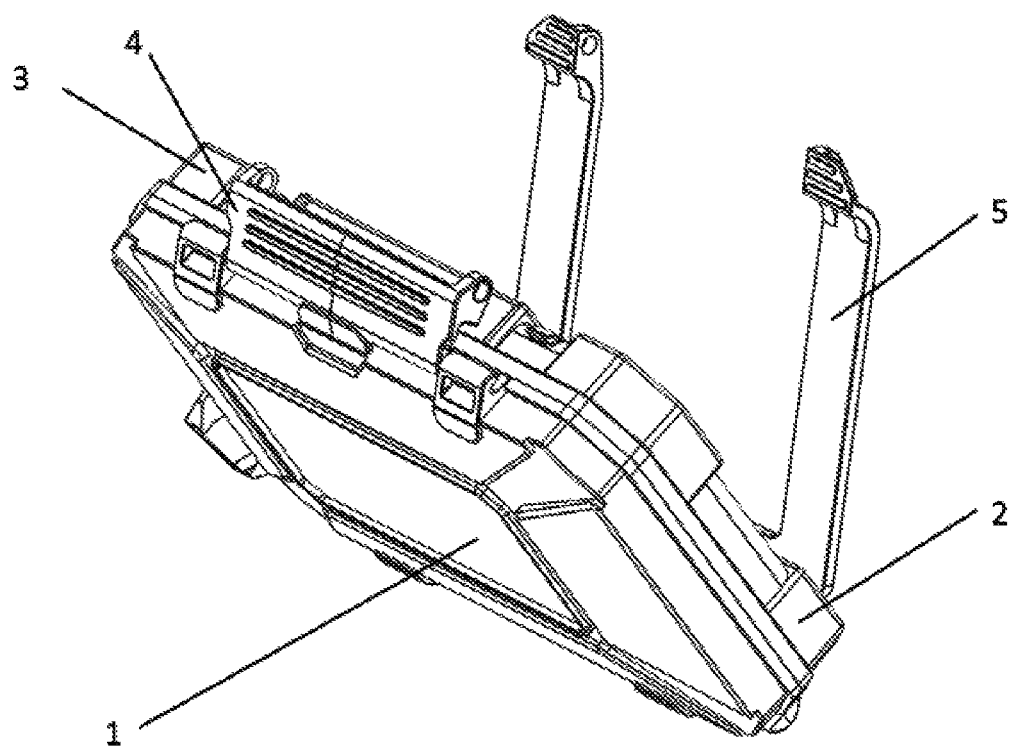
FIG. 6 is an alternate perspective view of an attachable protective container in accordance with one or more embodiments with attachment straps disengaged from their locking features.
Figure 7:
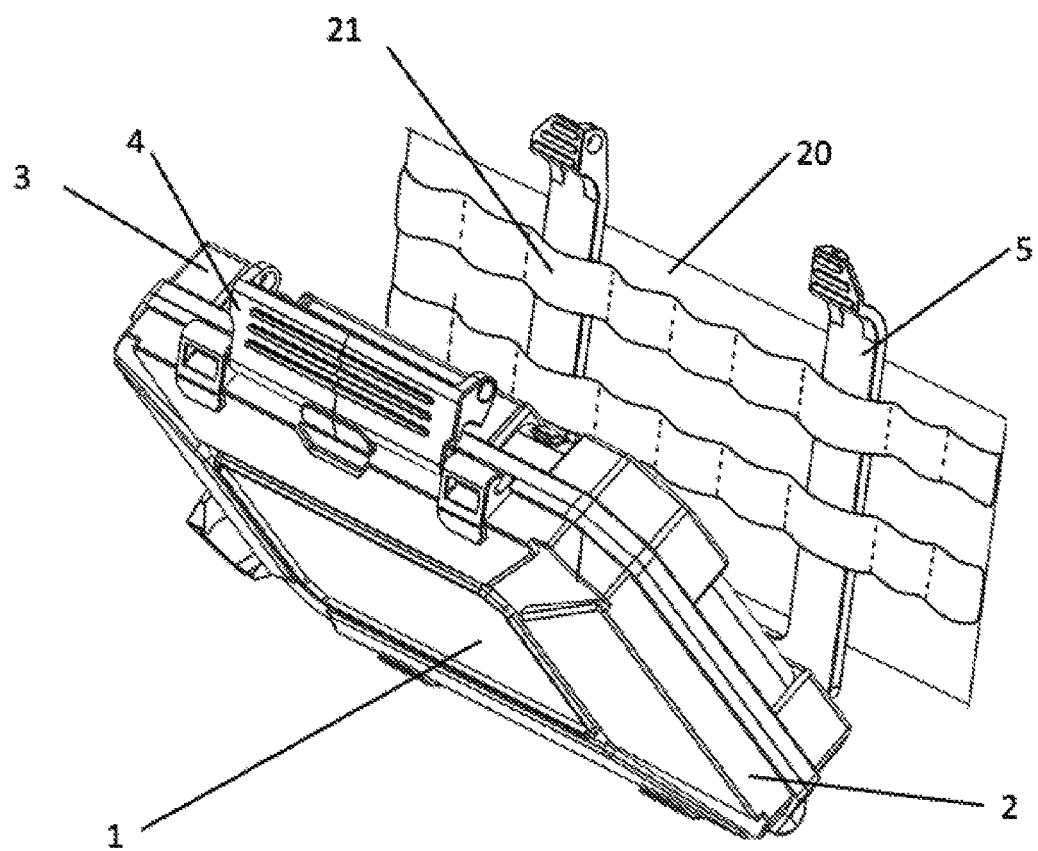
FIG. 7 is a perspective view of an attachable protective container in accordance with one or more embodiments with attachment straps engaged in a sewn nylon webbing assembly.

FIG. 6 and FIG. 7 are illustrations showing an embodiment of an attachable protective container 1 with released strap components 5 prior to and after being inserted through webbing loops 21. After insertion, the strap components 5 can be rotated until they engage protrusions on the back hollow structure 3 thus securing the attachable protective container 1 to the webbing loops 21 and their backing structure 20. This attachment device and method allows rapid, secure attachment and detachment on and off load-bearing equipment.

Figure 8:
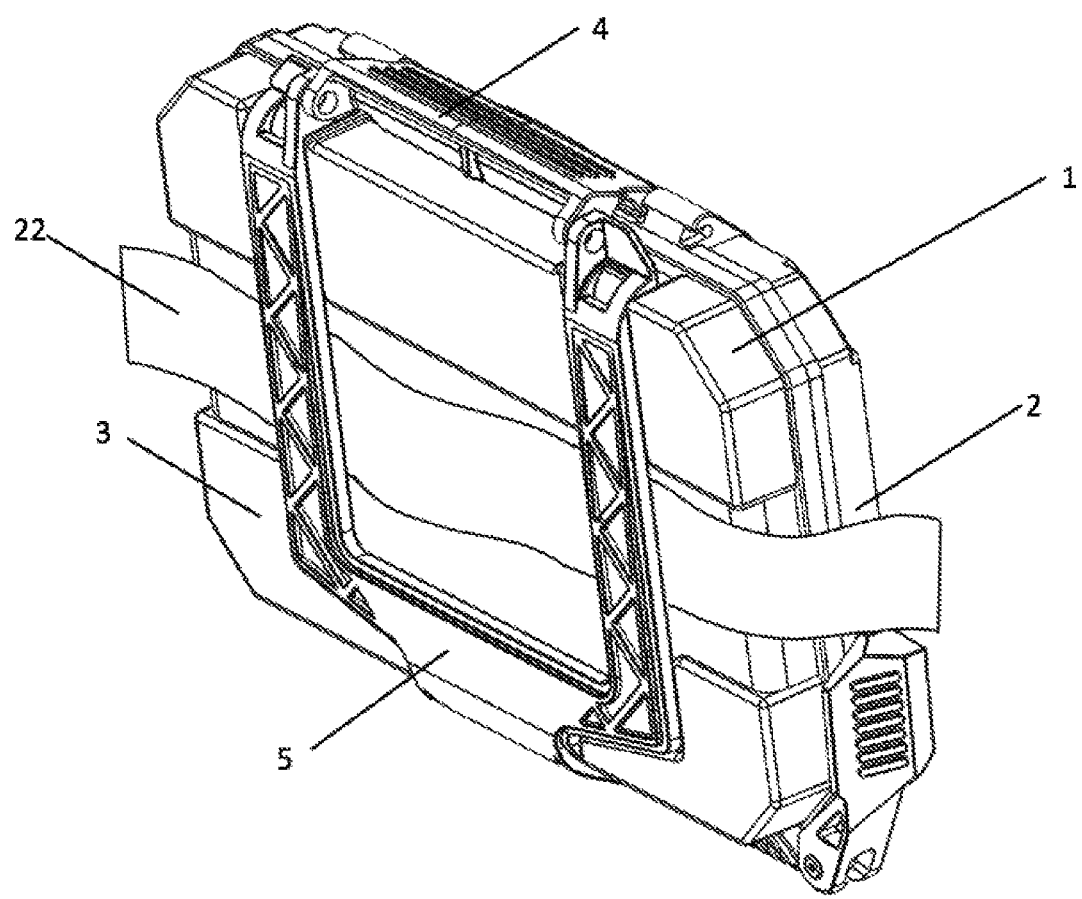
FIG. 8 is a perspective view of an attachable protective container in accordance with one or more embodiments with attachment straps closed to capture a flexible webbing strap.

FIG. 8 shows and alternate perspective illustration of an embodiment of an attachable protective container 1 further showing a section of material 22 slideably captured between a strap component 5 and the back hollow structure 3. The material 22 can be captured by opening the releasing the strap component 5 as shown in FIG. 6, inserting the material 22 between the strap component 5 and the back hollow structure 3 and then rotating the strap component relative the back hollow structure until the strap component's 5 distal strut windows engage the protrusions on the back hollow structure 3. The material 22 could be nylon webbing, cotton canvas, or other flexible organic or synthetic materials as known to those skilled in the art.

Figure 9:
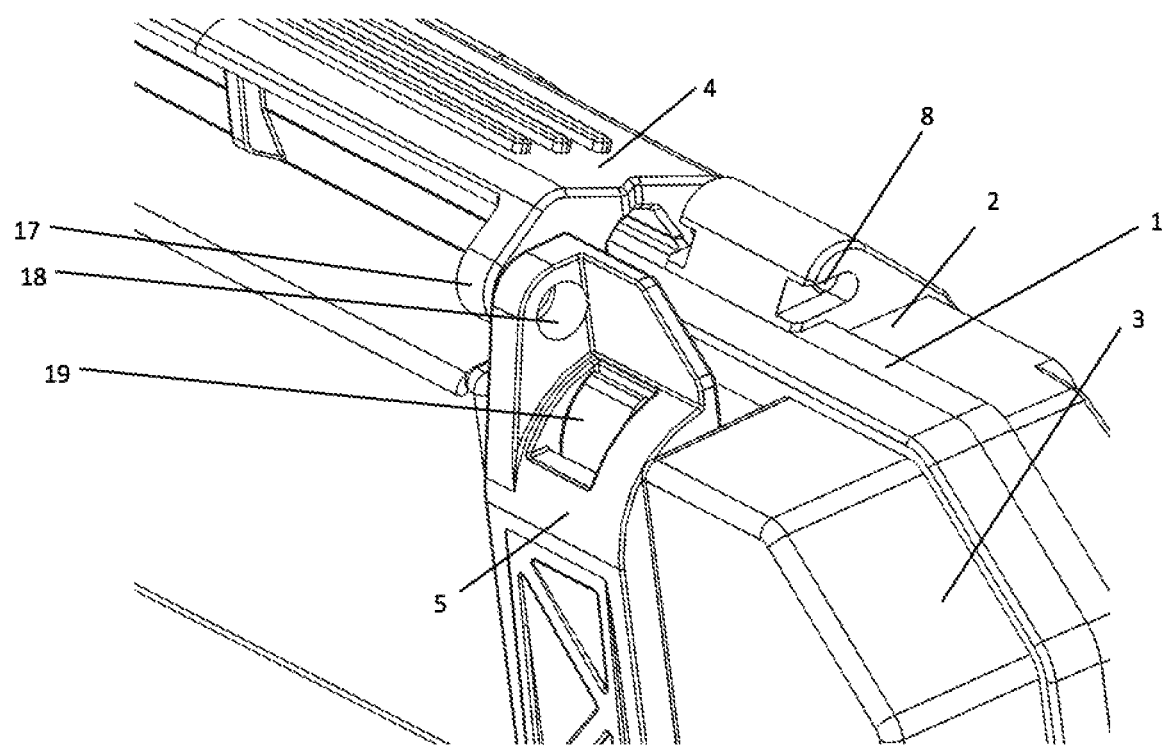
FIG. 9 is a partial close-up perspective view of a strap latch assembly in accordance with one or more embodiments including aligned holes to accept security devices.
Figure 10:
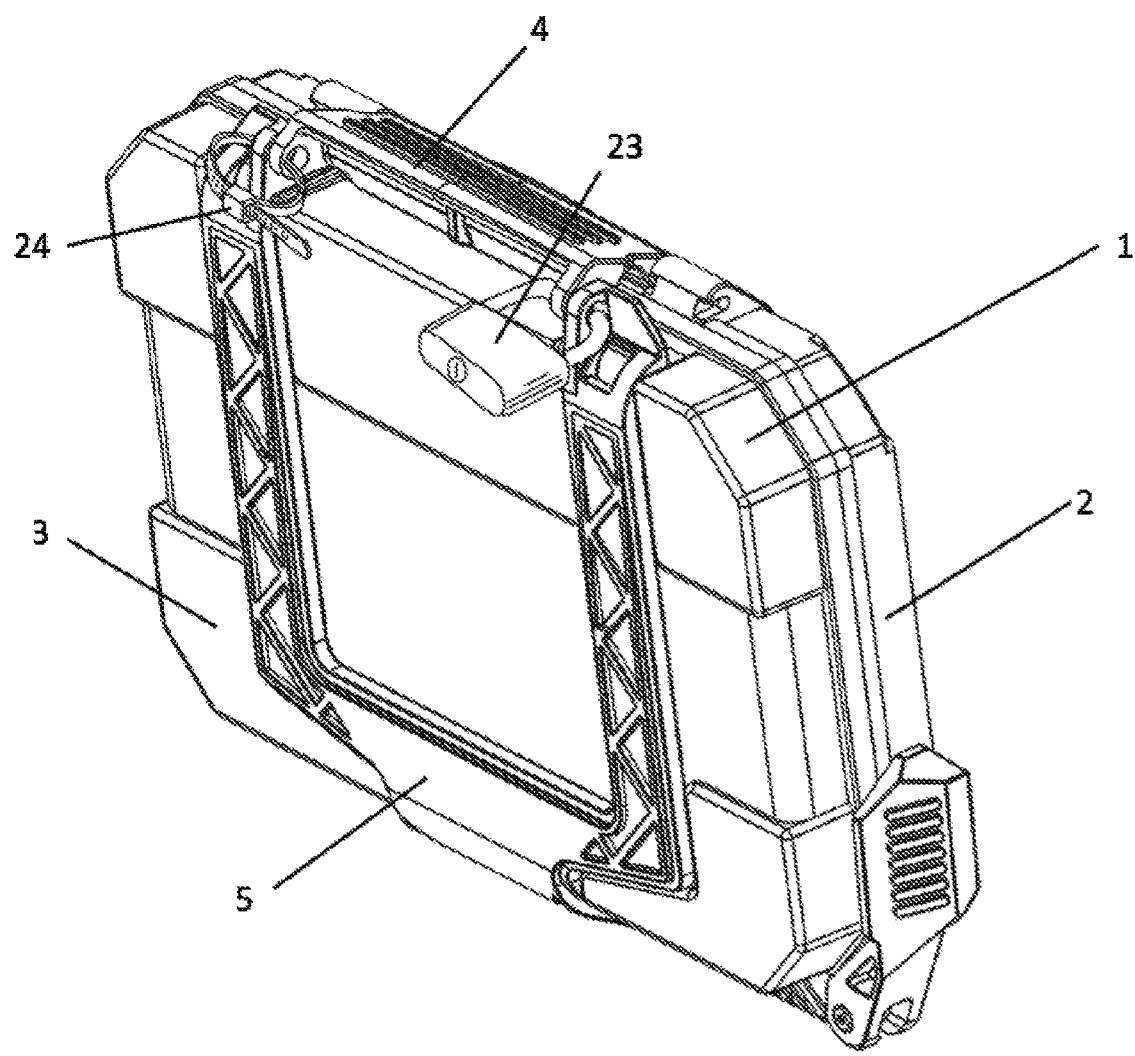
FIG. 10 is a perspective view of an attachable protective container in accordance with one or more embodiments with security devices attached.

FIG. 9 shows a close-up section detail view of an attachable protective container 1 with the strap components' 5 distal strut window engaged with the protrusion 19 of the back hollow structure 3. Furthermore, in this configuration, an aperture 18 approximate to the distal strut window on the strap component 5 is aligned with the distal end of the latch 4 that includes an aperture 17 that is approximately coaxial with the strap component aperture 18. Placing an object through the two apertures 17 and 18 prevents the strap component from being released from the back hollow structure 3 and further prevents the latch 4 from being released. While the two apertures 17 and 18, are occupied by a structure such as a padlock 23, tamperproof seal 24, or other binding feature, as best illustrated in FIG. 10, the attachable protective container is secured to any material between the strap component 5 and back hollow structure 3 but also prevents access to the protective space created by the back hollow structure 3 and the front hollow structure 2. The apertures 17 & 18 need not be closed holes as shown and may also be partially open, said opening being smaller than the object used to lock the two components together.

Figure 11:
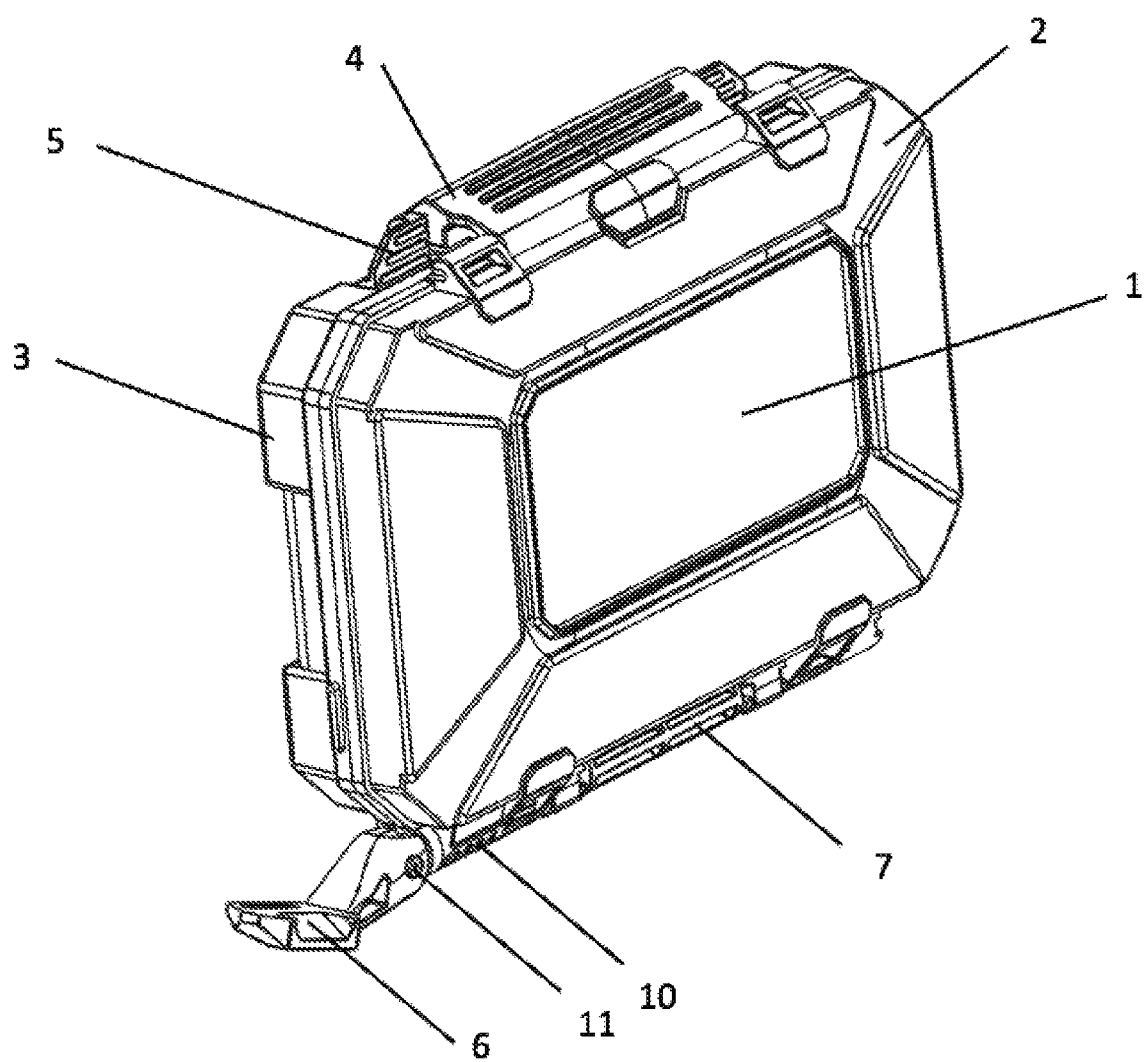
FIG. 11 is a perspective view of an attachable protective container in accordance with one or more embodiments with a friction lever in its open position.
Figure 12:
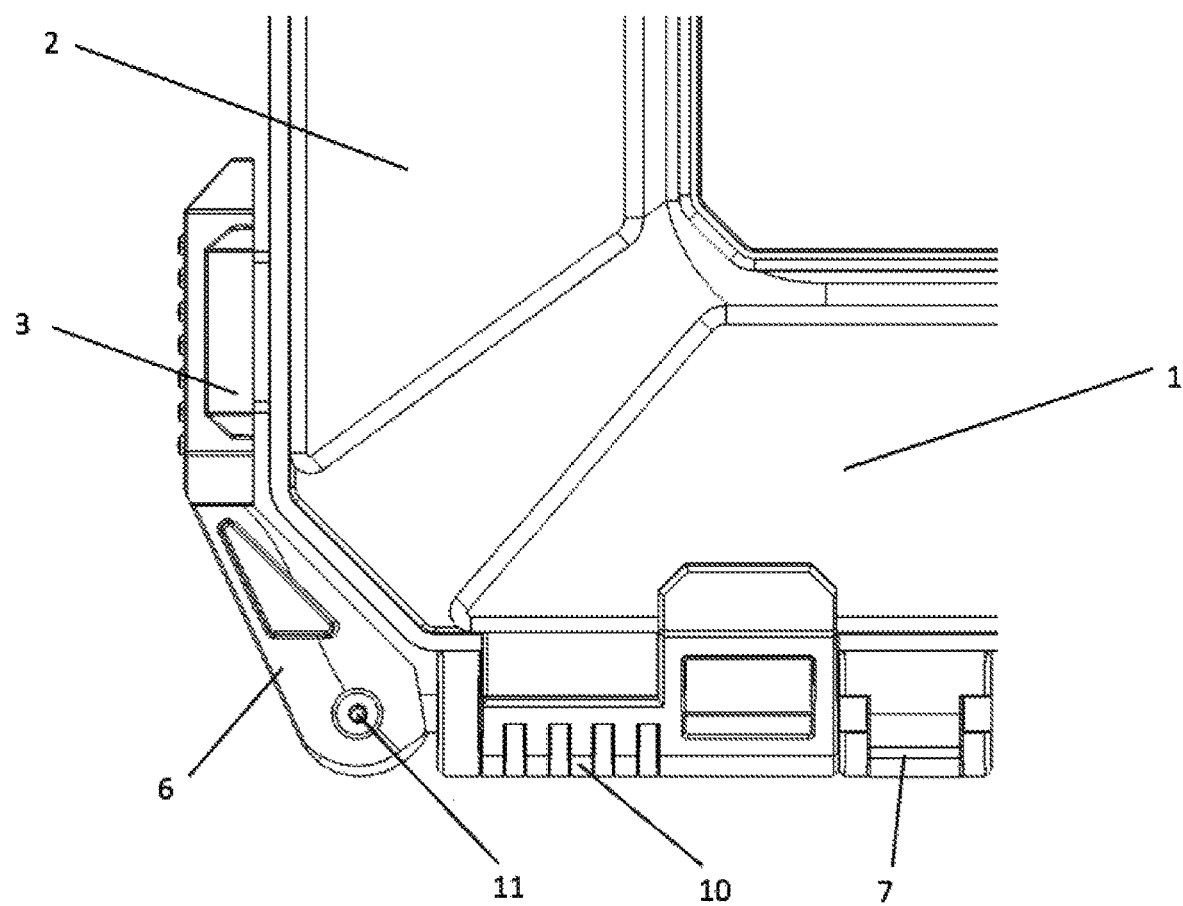
FIG. 12 is a partial close-up view of a friction hinge mechanism in accordance with one or more embodiments in its closed position.
Figure 13A:
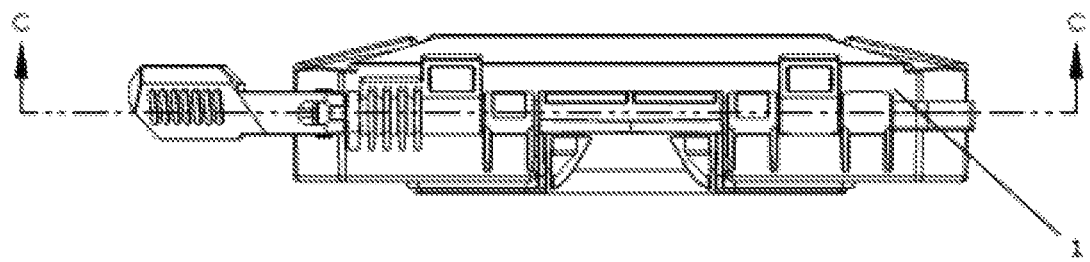
FIG. 13A is a bottom view of an attachable protective container in accordance with one or more embodiments showing a section line corresponding to FIG. 13B.
Figure 13B:
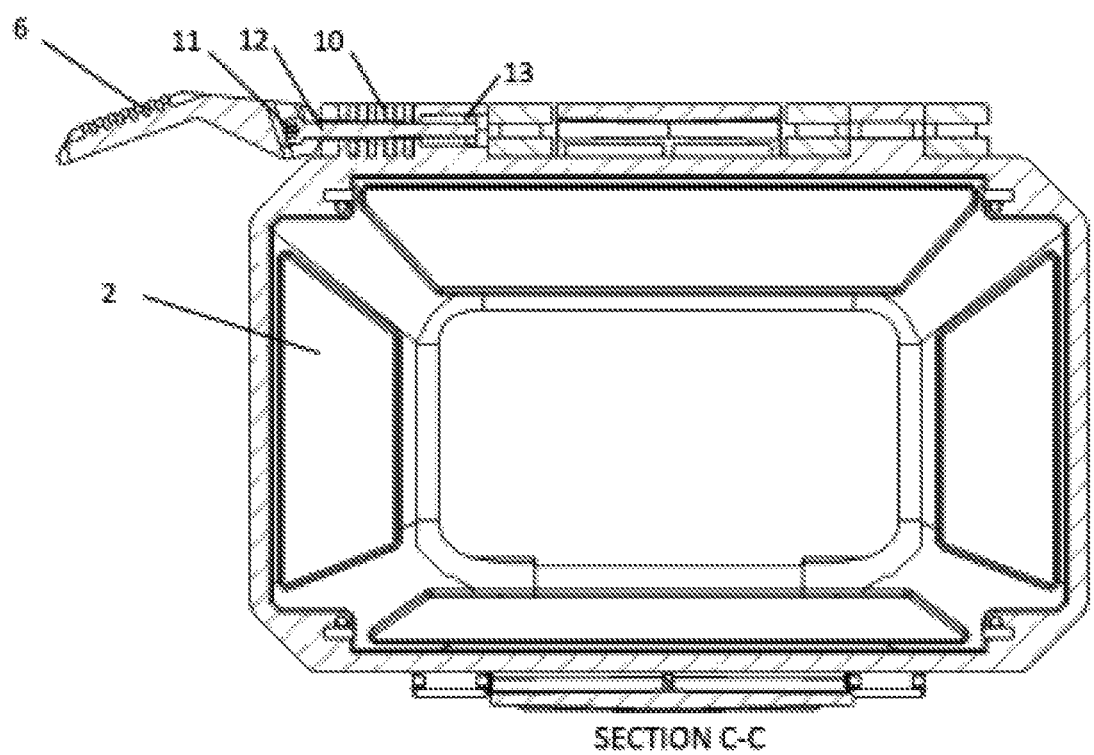
FIG. 13B is a cross-sectional view of an attachable protective container in accordance with one or more embodiments showing a friction hinge mechanism.
Figure 15:
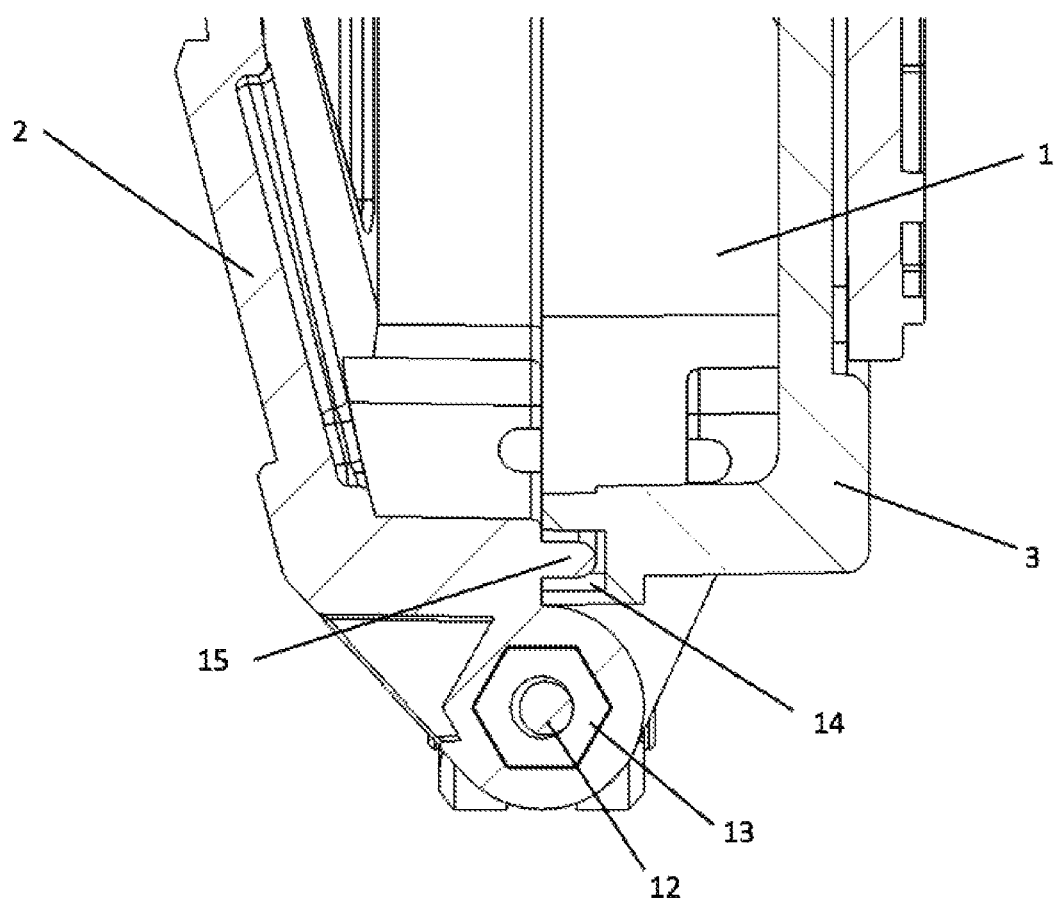
FIG. 15 is a cross-sectional view perpendicular to the axis of a friction hinge mechanism in accordance with one or more embodiments.

FIG. 11 shows perspective illustration of an embodiment of an attachable protective container 1 including the cam lever 6 in its open position rotated around a pivot pin 11. FIG. 12 shows a front view of attachable protective container 1. FIG. 13A shows a section view of front view FIG. 13B of an attachable protective container 1. The pivot pin 11 is attached to a helical screw component 12 that is coaxial to the hinge assembly 7. The cam lever 6 has a proximal and distal end. On the distal end of the cam lever 6 a handle is situated allowing the user to rotate the cam lever around the pivot pin's 11 axis and also rotate the helical screw 12 around its longitudinal axis. As shown in FIG. 12, protrusions from the back hollow structure 3 and front hollow structure 2 are apposed to each other and alternately spaced along the axis of the helical screw. These protrusions comprise a friction assembly 10. Each protrusion has an aperture through which the helical screw 12 can pass. The helical screw 12 has a proximal and distal end. An aperture perpendicular to the axis of the helical screw 12 accepts the pivot pin 11. The proximal end of the helical screw 12 includes helical external threads. The helical external threads on the proximal end of the helical screw 12 are engaged in an internally threaded nut 13 captured in a recess in the front hollow structure 2 that is coaxial to the helical screw's 12 longitudinal axis and located on the opposite side of the friction assembly 10 relative to the position of the cam lever 6. FIG. 15 further shows a section view perpendicular to the axis of the helical screw 12.

Figure 14:
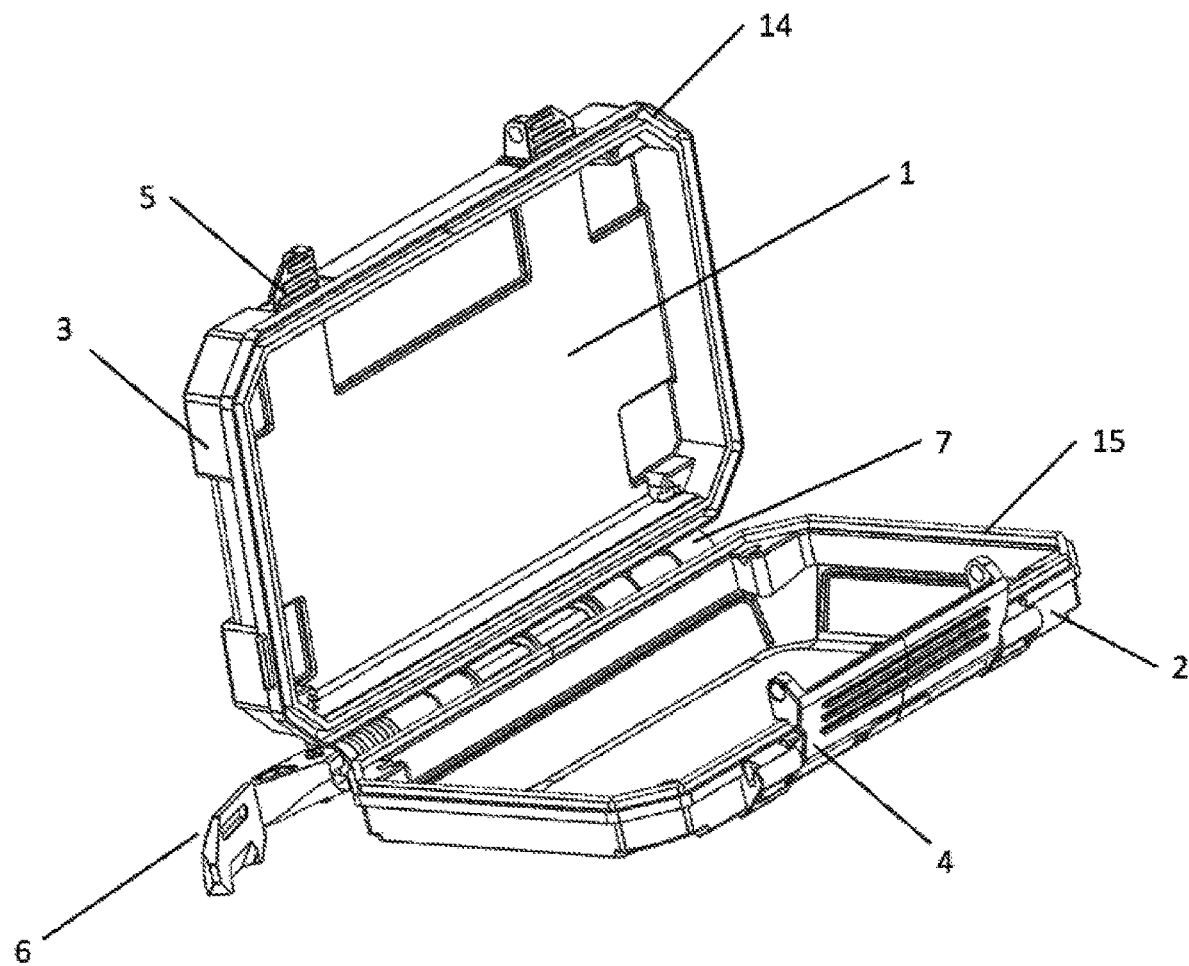
FIG. 14 is a perspective view of an attachable protective container in accordance with one or more embodiments with a friction lever in its open position with the container open to 90°.

Rotating the cam lever's 6 distal handle away from the attachable protective container 1 reduces the friction created by the friction assembly 10 by increasing the distance between the internally threaded nut 13 and the pivot pin 11. Rotating the cam lever's distal handle towards the body of the attachable protective container 1 decreases the distance between the internally threaded nut 13 and the pivot pin, which causes compression between the alternating components of the friction assembly. Rotating the helical screw along its longitudinal axis via the cam lever 6 serve to further shorten or lengthen the distance from the pivot pin 11 to the internally threaded nut to further increase or decrease friction. The adjustable friction created by the friction assembly 10, allows the user to tune the amount of force required to open and close the back hollow structure 3 and front hollow structure 2. As shown in FIG. 14, this also allows users to tune the friction and position the front hollow structure relative to the back hollow structure at an angle, such as 90 degrees that allows viewing of electronics protective cavity without requiring the user to continuously hold the position the front hollow structure with a hand or hands. This is especially useful when the attachable protective container is secured to the front of a ballistic vest, allowing the user to quickly view equipment inside the front hollow structure 2 without needing to use their hands to maintain the position the front hollow structure.

It can be appreciated that the cam lever 6 can have a configuration and/or shape that correspond to an exterior surface or edge of the hollow structures 2, 3 so that it is flush therewith or follows a contour of the hollow structures 2, 3 when in a closed position towards the body of the attachable protective container 1.

FIG. 14 further shows an open attachable protective container that includes a protruding feature 15 continuously disposed around the perimeter of a front hollow structure 2. A corresponding recessed feature 14 with a bottom, lateral and medial wall, disposed around the perimeter of the back hollow structure 3 is also shown. A gasket, o-ring, or other sealing structure known to those skilled in the art may be placed in the recessed feature 14 such that when the front hollow structure 2 and back hollow structure 3 are apposed, and the gasket, o-ring, or other sealing structure is compressed, creating a barrier to fluids, gases, and or particulate matter. FIG. 15 shows the protruding feature 15 engaged in the recessed feature 14 when the back hollow structure 3 and front hollow structure 2 are apposed.

In order to reduce or eliminate electromagnetic reception and or transmission from devices enclosed in the cavity created by the apposed back hollow structure 3 and front hollow structure 2, the back hollow structure 3 and front hollow structure 2 may be comprised of materials such as metal-fiber infused polymer, metal-plated carbon-fiber infused polymer, conductive metals, or other materials known to those skilled in the art. By creating a continuous conductive covering around an enclosed device, the attachable protective container 1 acts as a faraday cage, consequently resisting or attenuating electromagnetic waves moving across the attachable protective container's 1 walls. In some embodiments, the container walls are made from an injection-molded polypropylene infused with carbon fiber, which has been plated with nickel. In some embodiments, the conductive filler, such as nickel-plated carbon fiber accounts for 20% of the total polymer's volume but may range from approximately 5% to 50% of the total volume of the polymer. In some embodiments the attachable protective container's 1 walls are 3 mm thick and in other embodiments, the attachable protective container's walls range from approximately 1 mm to 10 mm.

Figure 16A:
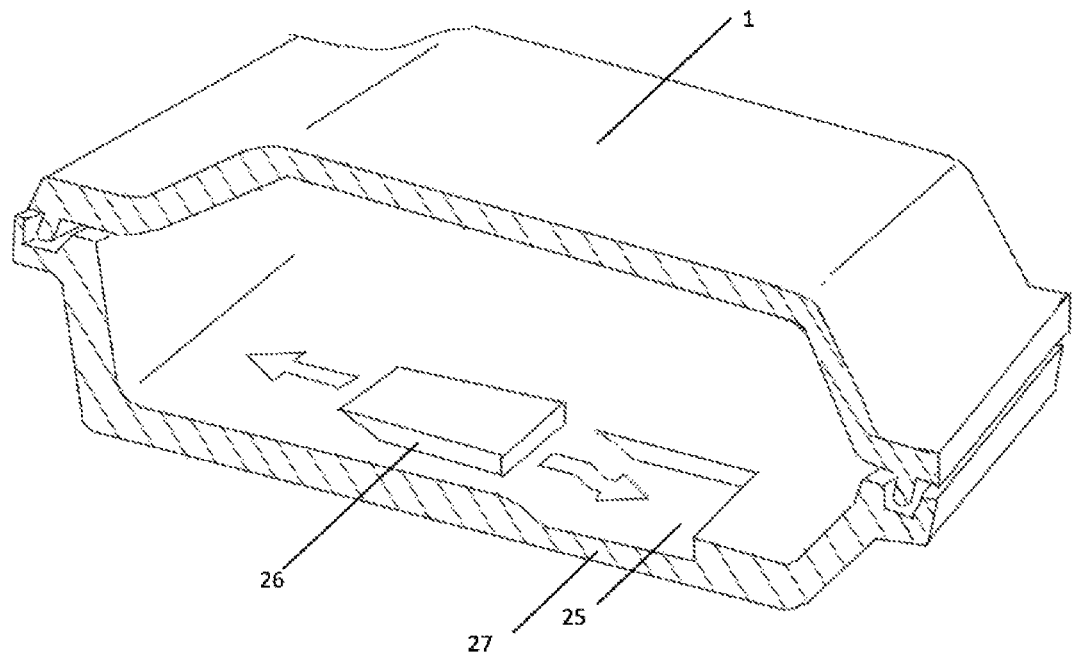
FIG. 16A is a partial cross-sectional view of an attachable protective container in accordance with one or more embodiments showing a sliding additional panel and a recessed channel.
Figure 16B:
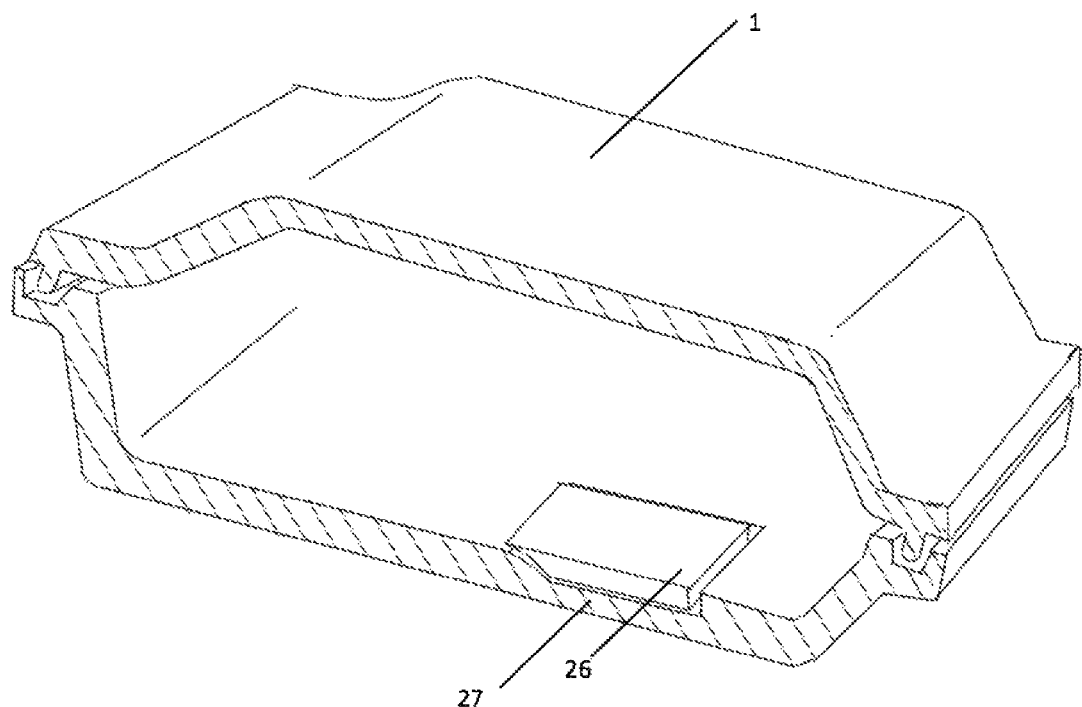
FIG. 16B is a partial cross-sectional view of an attachable protective container in accordance with one or more embodiments showing a sliding additional panel engaged in a recessed channel.

As shown FIG. 16A and FIG. 16B, partial section views of an attachable protective container 1, the walls of an attachable protective container may be designed to include a recessed channel 25, which accepts an additional panel 26 of the same or similar material. The additional panel 26 may be situated in the recessed channel 25 such that the combined thickness of the additional panel and remaining wall 27 at the location of the recessed channel are sufficient to impede electromagnetic waves from passing through the wall of the attachable protective container. If the additional panel 26 is moved out of the recessed channel 25, the remaining thinner wall 27 at the location of the recessed channel may not be sufficient to impede electromagnetic waves from passing through the wall of the attachable protective container. As such, the user may move the additional panel to allow or deny transmission or reception of electromagnetic waves to devices within the cavity of the attachable protective container. The additional panel 26 may be mated to the wall of the attachable protective container by way of apposing magnets, a dovetail slot in the recessed channel that slideably captures the additional panel or many other mechanisms as known to those skilled in the art.

In some embodiments, the recessed channel 25 can include an angled edge, a planar portion and an oppositely located ledge. The additional panel 26 can include an angled edge and planar portion. The angled edge of the recessed channel 25 can be configured to allow the additional panel 26 to easily slide in and out thereof, with the ledge preventing further movement of the additional panel 26. The angled edge of the additional panel 26 can be configured to allow for easy sliding of the additional panel 26 out of the recessed channel 25.

Although the present technology has been disclosed in the context of certain preferred embodiments and examples, it will be understood by those skilled in the art that the present technology extends beyond the specifically disclosed embodiments to other alternative embodiments and/or uses of the present technology and obvious modifications and equivalents thereof. Thus, it is intended that the scope of the present technology herein disclosed should not be limited by the particular disclosed embodiments described above, but should be determined only by a fair reading of the claims that follow.

There has thus been outlined, rather broadly, features of the present technology in order that the detailed description thereof that follows may be better understood and in order that the present contribution to the art may be better appreciated.

Numerous objects, features and advantages of the present technology will be readily apparent to those of ordinary skill in the art upon a reading of the detailed description of the present technology, but nonetheless illustrative, embodiments of the present technology when taken in conjunction with the accompanying drawings.

As such, those skilled in the art will appreciate that the conception, upon which this disclosure is based, may readily be utilized as a basis for the designing of other structures, methods and systems for carrying out the several purposes of the present technology. It is, therefore, that the claims be regarded as including such equivalent constructions insofar as they do not depart from the spirit and scope of the present technology.

It is another object of the present technology to provide a new and novel attachable portable protective container that may be easily and efficiently manufactured and marketed.

An even further object of the present technology is to provide a new and novel attachable portable protective container that has a low cost of manufacture with regard to both materials and labor, and which accordingly is then susceptible of low prices of sale to the consuming public, thereby making such attachable portable protective containers economically available to the buying public.

Still another object of the present technology is to provide a new attachable portable protective container that provides in the apparatuses and methods of known technology some of the advantages thereof, while simultaneously overcoming some of the disadvantages normally associated therewith.

These together with other objects of the present technology, along with the various features of novelty that characterize the present technology, are pointed out with particularity in the claims annexed to and forming a part of this disclosure. For a better understanding of the present technology, its operating advantages and the specific objects attained by its uses, reference should be made to the accompanying drawings and descriptive matter in which there are illustrated embodiments of the present technology. Whilst multiple objects of the present technology have been identified herein, it will be understood that the claimed present technology is not limited to meeting most or all of the objects identified and that some embodiments of the present technology may meet only one such object or none at all.

While embodiments of the attachable portable protective containers have been described in detail, it should be apparent that modifications and variations thereto are possible, all of which fall within the true spirit and scope of the present technology. With respect to the above description then, it is to be realized that the optimum dimensional relationships for the parts of the present technology, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present technology. For example, any suitable sturdy material may be used instead of the above-described. And although attachable portable protective containers have been described, it should be appreciated that the present technology herein described is also suitable for attaching any container, case or the like to a webbing or article of clothing.

Therefore, the foregoing is considered as illustrative only of the principles of the present technology. Further, since numerous modifications and changes will readily occur to those skilled in the art, it is not desired to limit the present technology to the exact construction and operation shown and described, and accordingly, all suitable modifications and equivalents may be resorted to, falling within the scope of the present technology.

What is claimed as being new and desired to be protected by Letters Patent of the United States is as follows:

1. A container system comprising:
    enclosable structures pivotably associated with each other to permit relative rotation and opening and closing of the structures, the structures being apposed to each other and configured to create a sealed cavity when in a closed position; and
    an attachment component including a distal end and a proximal end, the proximal end including a hinge mechanism associated with at least one of the structures, the distal end having a locking feature configured to releasably engage with a corresponding locking feature disposed on the at least one of the structures such that the attachment component captures a portion of material of a separate device between the attachment component and the at least one of the structures.

2. The system as claimed in claim 1 further comprising a hinge located along a first side of the structures to permit the relative rotation and opening and closing of the structures.

3. The system as claimed in claim 2, wherein the structures are a first structure and a second structure, the first structure further comprising a latch on a second side of opposite the first side, the latch being releasably engageable with a locking member associated with the second structure.

4. The system as claimed in claim 3, wherein an aperture is defined on the distal end of the attachment component and a corresponding aperture is defined on a lateral side of the latch such that when the aperture and the corresponding aperture are aligned a separate locking or tamper evident device is insertable through both apertures to secure the attachment component relative to the structures and prevent the latch from allowing the structures to be rotated apart.

5. The system as claimed in claim 1, wherein the locking feature of the attachment component defines a window configured to releasably engage with a protrusion of the at least one of the structures.

6. The system as claimed in claim 1, wherein a plurality of friction plates extending from each of the structures are aligned and compressed by a fastening member to increase or decrease a force required to open, close or move the apposed structures relative to each other.

7. The system as claimed in claim 6, wherein the fastening member is a helical screw and a helically threaded nut arrangement.

8. The system as claimed in claim 6, wherein the fastening member is a camming lever attached to a helical screw and helically threaded nut arrangement.

9. The system as claimed in claim 1, wherein the structures are comprised of conductive material or partially conductive material.

10. The system as claimed in claim 1, wherein at least one of the structures includes a recessed channel, and an additional panel slideably engageable with the recessed channel, the additional panel is configured to be moved from one position wherein a combined thickness of the additional panel and an apposed wall of the at least one of the structures is as thick or thicker than the rest of the at least one of the structures and another position wherein the additional panel is not inside the recessed channel, leaving the remaining thickness of the at least one of the structures at the location of the recessed channel less than the rest of the at least one of the structures.

11. A device comprising:
two hollow structures that are apposed and configure to create a sealed cavity;
a hinge located along a first side of the two hollow structures to permit relative rotation and opening and closing of the hollow structures;
a latch on a second side opposite the first side, the latch being fixed to one side and releasably engaged in the second hollow structure by way of a locking member;
an attachment component including a distal and proximal end, the proximal end comprised of a hinge mechanism connected to one or more of the hollow structures creating the sealed cavity, the distal end of the attachment component having at least one elongate member with a locking feature disposed on the distal end;
wherein the locking feature being able to releasably engage with a corresponding locking feature disposed on at least one of the hollow structures such that the attachment component captures a portion of material of a separate device between the attachment component and at least one of the hollow structures.

12. The device as claimed in claim 11, wherein a plurality of friction plates extending from each of the hollow structures are aligned and compressed by a helical screw and a helically threaded nut to increase or decrease a force required to open, close or move the two apposed hollow structures relative to each other.

13. The device as claimed in claim 11, wherein a plurality of friction plates extending from each of the hollow structures are aligned and compressed by a camming lever attached to a helical screw and helically threaded nut to increase or decrease the force required to open, close or move the hollow structures relative to each other.

14. The device as claimed in claim 11, wherein an aperture is defined on the distal end of the attachment component and a corresponding aperture is defined on a lateral side of the latch such that when the aperture and the corresponding aperture are aligned a separate locking or tamper evident device is inserted through both apertures to secure the attachment component relative to the hollow structures and prevent the latch from allowing the two hollow structures to be rotated apart.

15. The device as claimed in claim 11, wherein the hollow structures are comprised of conductive material.

16. The device as claimed in claim 15 wherein the conductive material is metal and/or a metal-filled polymer.

17. The device as claimed in claim 11, wherein at least one of the hollow structures includes a recessed channel, and an additional panel slideably engageable with the recessed channel, the additional panel is configured to be moved from one position wherein a combined thickness of the additional panel and an apposed wall of the at least one of the hollow structures is as thick or thicker than the rest of the at least one of the hollow structures and another position wherein the additional panel is not inside the recessed channel, leaving the remaining thickness of the at least one of the hollow structures at the location of the recessed channel less than the rest of the at least one of the hollow structures.

18. A device comprising:
two hollow structures that are apposed to create a sealed cavity;
a hinge located along a first side of the two hollow structures to permit relative rotation and opening and closing of the sealed cavity;
a latch on a second side opposite the first side, the latch being fixed to one side and releasably engaged in the second hollow structure by way of a locking member;
a recessed channel in at least one portion of the hollow structures slideably engaged with an additional panel, the additional panel able to be moved from one position wherein a combined thickness of the additional panel and an apposed wall of the hollow structure is as thick or thicker than the rest of the hollow structure and another position wherein the additional panel is no longer inside the recessed channel, leaving the remaining thickness of the hollow structure at the location of the recessed channel less than the rest of the hollow structure.

19. The device as claimed in claim 18, wherein the hollow structures and the additional panel are comprised of a conductive material.

20. The device as claimed in claim 19, wherein the conductive material is metal and/or a metal-filled polymer.

* * * * *